(12) United States Patent
Hovanetz

(10) Patent No.: US 6,868,531 B1
(45) Date of Patent: Mar. 15, 2005

(54) GENERATION OF ORDERED INTERCONNECT OUTPUT FROM AN HDL REPRESENTATION OF A CIRCUIT

(75) Inventor: Cory J. Hovanetz, Brooklyn Center, MN (US)

(73) Assignee: Unisys Corporation, Blue Bell, PA (US)

(*) Notice: Subject to any disclaimer, the term of this patent is extended or adjusted under 35 U.S.C. 154(b) by 31 days.

(21) Appl. No.: 10/330,984

(22) Filed: Dec. 27, 2002

(51) Int. Cl.[7] .............................................. G06F 17/50
(52) U.S. Cl. ............................................. 716/1; 716/12
(58) Field of Search .......................... 716/1, 12; 371/23; 364/488

(56) References Cited

U.S. PATENT DOCUMENTS

| | | | | |
|---|---|---|---|---|
| 5,425,036 A | * | 6/1995 | Liu et al. ..................... | 714/735 |
| 5,898,705 A | * | 4/1999 | Graef .......................... | 714/738 |
| 6,539,534 B1 | * | 3/2003 | Bennett ........................ | 716/17 |
| 6,684,376 B1 | * | 1/2004 | Kerzman et al. .............. | 716/8 |
| 6,701,289 B1 | * | 3/2004 | Garnett et al. ................ | 703/14 |
| 2003/0145288 A1 | * | 7/2003 | Wang et al. .................. | 716/2 |

* cited by examiner

*Primary Examiner*—Matthew Smith
*Assistant Examiner*—Sun James Lin
(74) *Attorney, Agent, or Firm*—Mark T. Starr; Charles A. Johnson; Shumaker & Sieffert, PA

(57) ABSTRACT

Techniques are described for generating and presenting interconnection information for a circuit in a manner that allows a designer to more easily validate the interconnectivity of the circuit. For example, a system comprises a computer-readable medium to store data that defines a circuit in accordance with a hardware description language. An interconnect analysis module processes the data to identify instances of circuit components having interconnects, and any signals coupled to the interconnects. The output includes an ordered representation of the interconnects, and specifies for each interconnect a respective signal associated with the interconnect and the other interconnects coupled to the signal. The output may be arranged to order the representation based on page numbers of schematic diagrams with which the instances are associated. The interconnect analysis module may generate the output in a two-dimensional format having rows and columns suitable for display in a spreadsheet application.

34 Claims, 4 Drawing Sheets

| SCHEMATIC_INSTANCE_PIN | SIGNAL_NAME | SCHEMATIC_INSTANCE_PIN | SCHEMATIC_INSTANCE_PIN |
|---|---|---|---|
| PAGE1_SEQUENCER/VCC | V5 | PAGE2_REGISTER1/VCC | PAGE3_LATCH/VCC |
| PAGE1_SEQUENCER/GND | MAIN_GND | PAGE2_REGISTER1/GND | PAGE3_LATCH/GND |
| PAGE1_SEQUENCER/ENABLE_A | ENABLE_REG | PAGE2_REGISTER1/LOAD | |
| PAGE1_SEQUENCER/ENABLE_B | ENABLE_LATCH | PAGE3_LATCH/ENABLE | |
| PAGE1_SEQUENCER/CLOCK | SYSTEM_CLOCK | PAGE2_REGISTER1/CLOCK | PAGE3_LATCH/CLOCK |
| PAGE1_SEQUENCER/CLEAR | CTRL_CLEAR | | |
| PAGE1_SEQUENCER/STROBE | CTRL_STROBE | | |
| PAGE1_SEQUENCER/D0 | OUTPUT_D0 | PAGE2_REGISTER1/IN0 | |
| PAGE1_SEQUENCER/D1 | OUTPUT_D1 | PAGE2_REGISTER1/IN1 | |
| PAGE1_SEQUENCER/D2 | OUTPUT_D3 | PAGE3_LATCH/IN0 | |
| PAGE1_SEQUENCER/D3 | OUTPUT_D4 | PAGE3_LATCH/IN1 | |
| PAGE2_REGISTER1/GND | MAIN_GND | PAGE3_LATCH/GND | PAGE3_LATCH/GND |
| PAGE2_REGISTER1/VCC | V5 | PAGE1_SEQUENCER/VCC | PAGE1_SEQUENCER/VCC |
| PAGE2_REGISTER1/IN0 | OUTPUT_D0 | PAGE1_SEQUENCER/D0 | |
| PAGE2_REGISTER1/IN1 | OUTPUT_D1 | PAGE1_SEQUENCER/D1 | |
| PAGE2_REGISTER1/OUT0 | REG_OUT0 | | |
| PAGE2_REGISTER1/OUT1 | REG_OUT1 | | |
| PAGE2_REGISTER1/LOAD | ENABLE_REG | PAGE1_SEQUENCER/ENABLE_A | |
| PAGE2_REGISTER1/CLOCK | SYSTEM_CLOCK | PAGE1_SEQUENCER/CLOCK | PAGE3_LATCH/CLOCK |
| PAGE3_LATCH/GND | MAIN_GND | PAGE2_REGISTER1/GND | PAGE3_LATCH/GND |
| PAGE3_LATCH/VCC | V5 | PAGE2_REGISTER1/VCC | PAGE1_SEQUENCER/VCC |
| PAGE3_LATCH/ENABLE | ENABLE_LATCH | PAGE1_SEQUENCER/ENABLE_B | |

FIG. 4

GENERATION OF ORDERED INTERCONNECT OUTPUT FROM AN HDL REPRESENTATION OF A CIRCUIT

TECHNICAL FIELD

The invention relates to electrical circuit design and, more particularly, computer-aided techniques to aid the design of electrical circuits.

BACKGROUND

As circuit designs continue to increase in performance and complexity, the design of such circuits becomes increasingly difficult and time consuming. A conventional electrical circuit may include hundreds or even thousand of discrete components, often in the form of interconnected integrated circuits. Each of these components may include a significant number of pins, allowing the components to be electrically coupled by a mesh of wires, traces, or other electrically conductive paths.

The task of designing an individual integrated circuit may be even more complex, as an integrated circuit often contains hundreds of thousands or even millions of individual transistors that form functional blocks. Electrical paths within the integrated circuit are coupled to "ports" associated with the functional blocks.

A designer often employs computer-aided techniques to aid the design, simulation, and verification of an electrical circuit. For example, the designer may utilize one or more software programs, also referred to as circuit design "tools" or "utilities," to define the electrical circuit at an abstract or functional level. These tools typically provide extensive software libraries of electrical components, and present an interface with which the designer is able to graphically develop the circuit. In particular, the designer interacts with the interface to graphically form of one or more schematic diagrams having interconnected components or functional blocks.

Alternatively, the designer may utilize an editor or other software application to describe the circuit in accordance with a hardware description language (HDL). Examples of widely-used HDLs include the Very high-speed integrated circuits Hardware Description Language (VHDL) and Verilog™, which is described in the IEEE Verilog 1364-2000 standard. These languages support syntaxes that appear similar to software programming languages, such as C++ and Java, and allow the designer to define and simulate the circuit by using high-level code to describe the structure and behavior of the circuit.

In order to further aid the validation and debugging of the circuits being designed, these computer aided techniques typically include functionality to produce a "netlist" that describes the defined signals that interconnect the circuit components. A typical netlist report generated by a conventional circuit design tool displays the signals defined for the circuit in alphabetical order. The following table illustrates a portion of an example netlist:

TABLE 1

| Signal Name | Instance Name | Physical Pin Name | Part Name |
|---|---|---|---|
| A20GATE | R62 | 1 | RES_SM |
| A20GATE | U1 | Y22 | COMP_CONN_M |
| CLK1 | R30 | 1 | RES_SM.1 |

TABLE 1-continued

| Signal Name | Instance Name | Physical Pin Name | Part Name |
|---|---|---|---|
| CLK1 | U2 | P17 | CONN_COMP_L1 |
| CLK1 | P2 | 9 | PA838383 |

Using netlist reports for validation of the interconnectivity of the circuit can be cumbersome. In particular, the designer may spend a significant amount of time crosschecking the signals listed alphabetically by the netlist report with the interconnected components defined by the schematic diagrams or the hardware description language. This process is even more difficult for complex circuits having hundreds or thousands of signals.

SUMMARY

In general, the invention is directed to techniques for generating and presenting interconnection information for a circuit in a manner that allows a designer to more easily validate the interconnectivity of the circuit. As described, an interconnect analysis module may apply the techniques to process a hardware description language (HDL) definition of the circuit to identify defined "instances" of electrical components for the circuit. For each instance, the interconnect analysis module determines the interconnects, e.g., pins or ports, associated with the instance, and the signals associated with the interconnects.

The interconnect analysis module generates output that includes an ordered representation of the identified instances and their interconnects. For example, the output may be arranged to order the representation based on page numbers of schematic diagrams with which the instances are associated. In addition, the interconnect analysis module generates the output to indicate a respective signal associated with each of the interconnects, and any other interconnects coupled to the signal. The interconnect analysis module may generate the output in a two-dimensional format in which the ordered representation of the interconnects is presented along a first dimension, and the respective signals and other interconnects coupled to the signals are presented along a second dimension.

For example, the interconnect analysis module may generate the output in matrix form having rows and columns suitable for presentation in a spreadsheet application. The rows may be arranged to list the ordered representation of the component instances and their respective interconnects. The columns may be arranged to list the respective signals associated with the instances designated along the rows, as well as any of the other interconnects coupled to the signals.

In one embodiment of the invention, a method comprises accessing data that defines a circuit in accordance with a hardware description language, and processing the data to identify instances of circuit components having interconnects and signals coupled to the interconnects. The method further comprises generating output that includes an ordered representation of the interconnects, and indicates for each interconnect a respective signal associated with the interconnect and the other interconnects coupled to the signal.

In another embodiment of the invention, a system comprises a computer-readable medium to store data that defines a circuit in accordance with a hardware description language, and an interconnect analysis module that processes the data to identify instances of circuit components having interconnects and signals coupled to the interconnects. The interconnect analysis module generates output that includes an ordered representation of the interconnects, and specifies for each interconnect a respective signal associated with the interconnect and the other interconnects coupled to the signal.

In another embodiment of the invention, a method comprises parsing data that defines an electrical circuit in accordance with a hardware description language to extract instance information that defines instances of components within the circuit, interconnect information that defines interconnects for the instances, and signal information that defines signals coupled to the interconnects. The method further comprises sorting the interconnect information based on logical names for the instances associated with the interconnects, sorting the instance information based on page identifiers for schematic diagrams associated with the instances, and generating output based on the sorted instance information and the sorted interconnect information.

The invention may provide one or more advantages. In general, the techniques may allow a designer to more easily validate circuit interconnections and locate errors. Arranging a representation of the instances in an order based on page numbers of a schematic diagram of the circuit, for example, may allow the designer to more easily validate the interconnect output relative to a graphical representation of the circuit. Furthermore, upon detecting an error within the output, the designer can immediately navigate to the relevant page of the schematic diagram and correct the error.

Moreover, by indicating the respective signal associated with each of the interconnects, and any other interconnects coupled to the signal, the designer need not page through a lengthy netlist report to identify coupled interconnects. Instead, the output can be arranged such that interconnects coupled by a common signal are presented along a single dimension of the output, e.g., along a single row. The availability of this information may, for example, reduce the amount of time spent by the designer in searching through one or more netlist reports.

As described above, the techniques may be used to generate the output in a format viewable within a spreadsheet application. Consequently, the output may easily be further sorted or manipulated using the functionality of the spreadsheet application. Unlike a conventional netlist report that lists defined signals, the interconnect analysis module may generate the output to display all of the interconnects within a circuit, including any interconnects for which a signal has not been defined, e.g., an unconnected pin.

The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

FIG. 4 illustrates an example window displayed by a spreadsheet application to present the interconnect output generated the interconnect analysis module.

DETAILED DESCRIPTION

Figure 1:
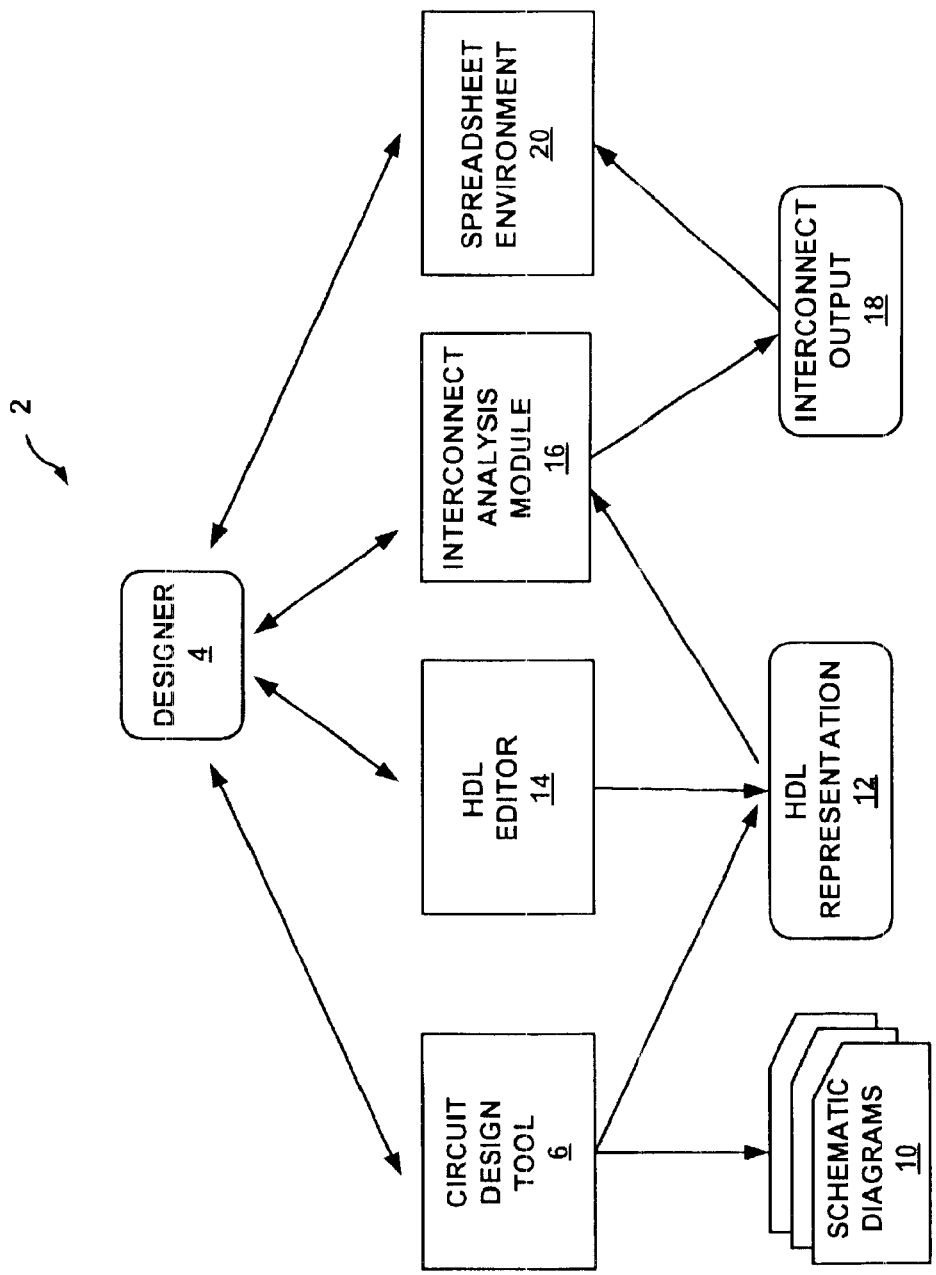
FIG. 1 is a block diagram illustrating an example system in which a designer makes use of computer-aided techniques to aid the design, simulation, and verification of an electrical circuit.

FIG. 1 is a block diagram illustrating an example system 2 in which a designer 4 makes use of computer-aided techniques to aid the design, simulation, and verification of an electrical circuit. Initially, designer 4 interacts with design tool 6 to develop a graphical representation of the circuit in the form of one or more pages of a schematic diagram 10. In particular, designer 4 invokes circuit design tool 6 to graphically layout component instances of an electrical circuit, and define signals to interconnect the instances. Circuit design tool 6 may comprise one or more software programs. An example of a circuit design tool is Concept® HDL from Cadence Design Systems, Inc. of San Jose, Calif.

During the design process, designer 4 directs circuit design tool 6 to automatically create an equivalent hardware description language (HDL) representation 12 of the circuit. Examples of widely-used HDLs include the Very high-speed integrated circuits Hardware Description Language (VHDL) and Verilog™. Circuit design tool 12 may create and store HDL representation 12 as data within one or more text files on a computer-readable medium.

Alternatively, or in addition, designer 4 may utilize an HDL editor 14 or other software application to describe the circuit in accordance with a hardware description language (HDL). More specifically, designer 4 may utilize HDL editor 14 to view and modify HDL representation 12 produced by circuit design tool 6. Alternatively, designer 4 may elect to forego use of circuit design tool 6, and instead utilize HDL editor 14 to describe the circuit in its entirety. The following code illustrates a small portion of an HDL representation 12 that defines two instances of circuit components having a number of different interconnects, and a number of signals to interconnect the instances:

```
COMPONENT HDR_2X2
    PORT (
        A:inout std_logic_vector (3 downto 0) := (others=>'Z')
    );
END COMPONENT;
COMPONENT HDR_2X5
    PORT (
        P1:in std_logic := 'U';
        P2:in std_logic := 'U';
        P3:in std_logic := 'U';
        P4:in std_logic := 'U';
        P5:in std_logic := 'U';
        P6:in std_logic := 'U';
        P7:in std_logic := 'U';
        P8:in std_logic := 'U';
        P9:in std_logic := 'U';
        P10:in std_logic := 'U'
    );
END COMPONENT;
signal AD: std_logic_vector (15 downto 0);
signal DAT: std_logic_vector (2 downto 0);
signal SIG_B: std_logic ;
signal SIG_A: std_logic ;
signal RESERVED_SIG1: std_logic ;
signal RESERVED_SIG2: std_logic ;
BEGIN
--Component Instances--
page4_I110: HDR_2X5
    PORT MAP(
        P1:in std_logic := AD(15);
        P2:in std_logic => AD(14);
        P3:in std_logic => AD(13);
        P4:in std_logic => AD(12);
        P5:in std_logic => AD(11);
        P6:in std_logic => DAT(2);
```

```
            P7:in std_logic => DAT(1);
            P8:in std_logic => SIG_B;
            P9:in std_logic => RESERVED_SIG1;
            P10:in std_logic => RESERVED_SIG2
);
page4_I111: HDR_2X2
    PORT MAP(
            A(0) => AD(13);;
            A(1) => AD(12);;
            A(2) => AD(11);;
            A(3) => AD(10);;
);
```

Upon creating HDL representation 12 of the circuit, designer 4 invokes interconnect analysis module 16 to analyze HDL representation 12, and generate interconnect output 18 to aid in verification and debugging of the designed circuit. As described in detail, interconnect analysis module 16 processes HDL representation 12 to identify the component instances of electrical components for the circuit. For each of the identified instances, interconnect analysis module 16 determines the interconnects, e.g., pins or ports, associated with the instance. In addition, interconnect analysis module 16 determines the signals associated with each of the interconnects by designer 4.

Based on the analysis, interconnect analysis module 16 generates interconnect output 18 to include an ordered representation of the identified instances and their interconnects. For example, interconnect analysis module 16 may arrange interconnect output 18 to list each identified instance and its respective interconnects. To aid in review, interconnect analysis module 16 may order the instances based on page identifiers for the schematic diagrams 10 with which the instances are associated. In other words, interconnect analysis module 16 may arrange interconnect output 18 to first list all instances defined within a first one of schematic diagrams 10, followed by all instances defined within a second one of schematic diagrams 10B, and so on.

Interconnect analysis module 16 may extract logical names for the interconnects and the instances from the HDL representation 12, and include the logical names within interconnect output 18. This may be advantageous in that designer 4 need not refer to physical pin or component names, for example, which may be common across multiple instances and difficult to identify. In some environments, a page number of the schematic diagram associated with a component instance may be embedded within the logical name of the instance, allowing interconnect analysis module 16 to easily extract the page number.

In addition, interconnect analysis module 16 generates interconnect output 18 to indicate a respective signal associated with each of the interconnects, as well as any of the other interconnects to which the signal is coupled. As one example, interconnect analysis module 16 may generate interconnect output 18 in a two-dimensional format in which the ordered representation of the instances and their interconnects is presented along a first dimension, and the respective signals and other interconnects to which the signals are coupled are presented along a second dimension.

As one example, interconnect analysis module 16 may generate interconnect output in matrix form having rows and columns suitable for display in a spreadsheet application 20, e.g., a matrix of comma separated values. Interconnect analysis module 16 may arrange the rows to list the ordered representation of the component instances and their respective interconnects. Further, interconnect analysis module 16 may arrange the columns of the matrix to list the respective signals associated with the instances and any of the other interconnects to which the signals are coupled.

Consequently, designer 4 may invoke spreadsheet application 20 to view interconnect output 18'. In addition, designer 4 may easily sort or otherwise manipulate interconnect output 18 using the functionality offered by spreadsheet application 20. One example of a spreadsheet application is Microsoft Excel from Microsoft Corporation of Redmond, Wash.

Interconnect module 16 may allow designer 4 to more easily validate the circuit connections, and locate any errors of the design. As one example, arranging interconnected output to include an ordered representation of the instances based on schematic diagrams 10 may allow designer 4 to more easily validate interconnect output 18 in view of the graphical representation of the circuit. Furthermore, upon detecting an error within interconnect output 18, designer 4 can immediately navigate to the relevant schematic diagram 10 and correct the error.

Moreover, by indicating the respective signal associated with each of the interconnects, and any other interconnects to which the signal is coupled, designer 4 need not page through a lengthy netlist report to identify coupled interconnects. Instead, interconnect analysis module 16 arranges interconnect output 18 to present all interconnects coupled by a common signal along a single dimension, e.g., along a single row. The availability of this information may, for example, reduce the amount of time spent by designer 4 in searching through one or more netlist reports.

Furthermore, unlike a conventional netlist report that lists defined signals, interconnect analysis module 16 may generate interconnect output 18 to display all of the interconnects for instances within a circuit, including any interconnects for which a signal has not been defined. In other words, interconnect analysis module 16 may process HDL representation to identify all defined instances and their interconnects, including unconnected pins or ports, and may include the unconnected interconnects within interconnect output 18.

Figure 2:
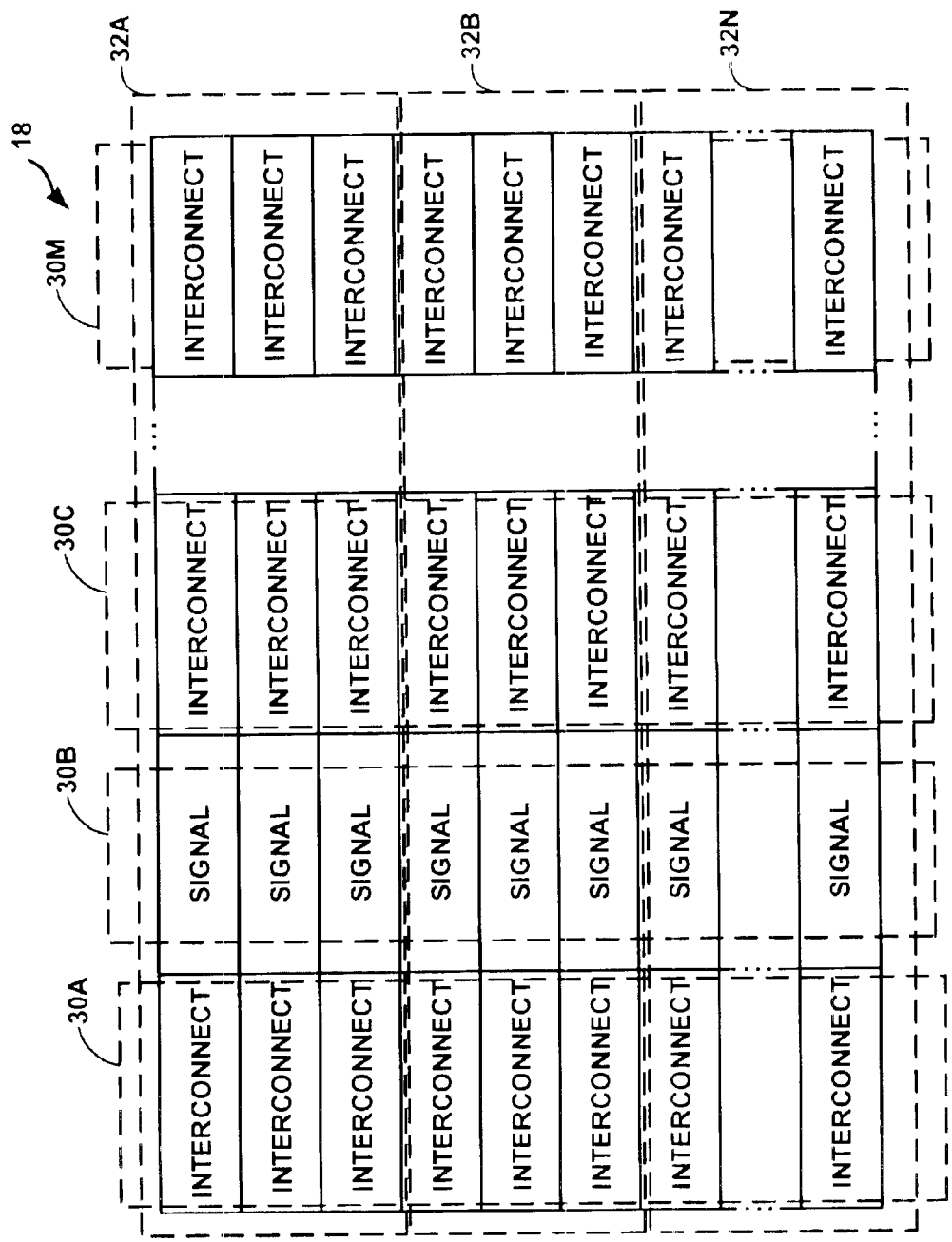
FIG. 2 illustrates an example interconnect output generated by an interconnect analysis module of the system of FIG. 1.

FIG. 2 illustrates an example of interconnect output 18 generated by interconnect analysis module 16. As illustrated, interconnect analysis module 16 generates interconnect output 18 in a two-dimensional format. In particular, interconnect output 18 includes a first column 30A to provide an ordered representation of the interconnects for the component instances identified within HDL representation 12.

Interconnect analysis module 16 may order the interconnects within first column 30A based on the schematic diagram 10 associated with instances. For example, interconnects 32A may be associated with component instances defined by a first schematic diagram 10. Similarly, interconnects 32B may be associated with component instances defined within a second schematic diagram 10.

Interconnect analysis module 16 generates interconnect output 18 to include a second column 30B that list the respective signals associated with the instances listed within the first column 30A. In addition, interconnect analysis module 16 generates interconnect output 18 to include one or more columns 30C–30M that list any of the other interconnects to which the signals are coupled. In this manner, interconnect output 18 presents each interconnect along a first dimension, and the respective signals and other interconnects to which the signals are coupled along a second dimension.

Figure 3:
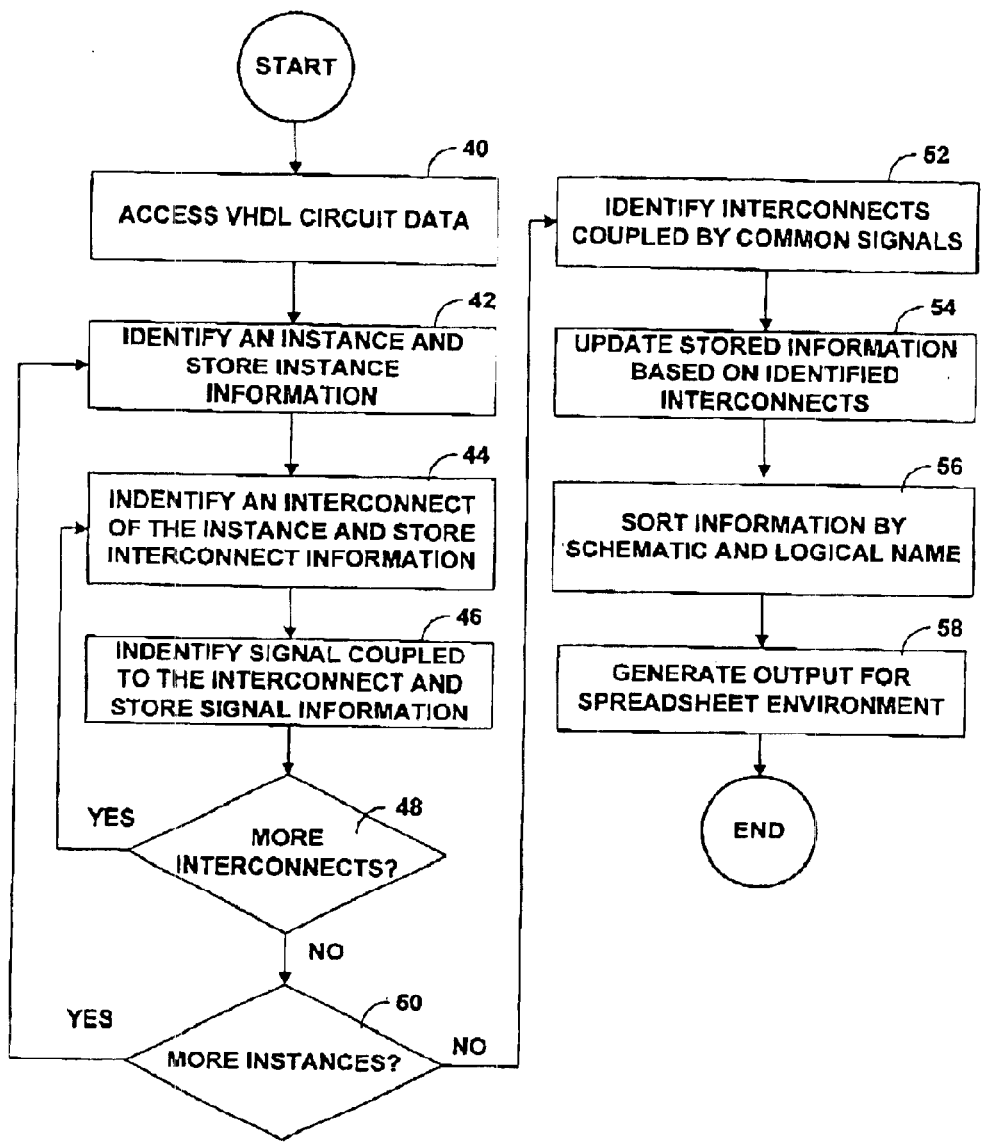
FIG. 3 is a flowchart illustrating example operation of the interconnect analysis module.

FIG. 3 is a flowchart illustrating example operation of interconnect analysis module 16. When invoked by designer 4, interconnect analysis module 16 accesses data that defines a circuit in accordance with a hardware description language, e.g., HDL representation 12 (40). For example, interconnect analysis module 16 may read HDL representation 12 as textual data from one or more files.

Interconnect analysis module 16 processes HDL representation 12 to identify a defined component instance, and stores instance information describing the component instance (42). For example, interconnect analysis module 16 may extract and store the logical name of the defined instance, as well as the schematic diagram 10 associated with the instances.

Next, interconnect analysis module 16 processes HDL representation 12 to identify the interconnects, e.g., pins or ports, of the instance, and stores interconnect information describing the interconnects (44). Interconnect analysis module 16 may store the logical name for the identified pin. For each interconnect, interconnect analysis module 16 identifies the signal, if any, associated with the interconnect, and stores signal information, e.g., a logical name, for the identified signal (46). Interconnect analysis module 16 may store instance information, interconnect information, and signal information within a three-dimensional data structure. Interconnect analysis module 16 continues to process HDL representation 12 until all of the instances and their respective interconnects have been identified (48, 50).

Once interconnect analysis module 16 has completely processed HDL representation 12, the module analyzes the stored information to identify any interconnects coupled by a common signal (52). For example, interconnect analysis module 16 may traverse the three-dimensional data structure using multiple passes to identify any interconnects associated with matching signal names. Interconnect analysis module 16 updates the information to indicate the other interconnects to which each interconnect is coupled (54).

Next, interconnect analysis module 16 sorts the information (56). For example, interconnect analysis module 16 may sort the three-dimensional data structure along the dimension storing the instance information based on the schematic diagram 10 associated with each instance. In addition, interconnect analysis module 16 may further sort the interconnect information based on the instance to which each interconnects belong. In this manner, interconnect analysis module 16 may order the information to define an ordered representation of the interconnects that is arranged by the schematic page and component instance.

Finally, interconnect analysis module 16 generates interconnect output 18 (58). As described above, interconnect analysis module 16 generates interconnect output 18 in a two-dimensional format viewable by spreadsheet application 20.

FIG. 4 illustrates an example window 60 displayed by spreadsheet application 20 to present interconnect output 18 generated by interconnect analysis module 16. As illustrated by window 60, the example interconnect output 18 includes a header row 62, followed by twenty-seven data rows. Each data row indicates a different interconnect defined within HDL representation 12. In this manner, column A provides a representation of the interconnects ordered by schematic page and instance.

Further, columns B list the respective signals associated with the instances listed within the column A. For example, window 60 indicates that interconnect PAGE_SEQUENCER/VCC listed in ROW 2, COLUMN 1, is associated with signal V5. In addition, columns B–D list any of the interconnects to which the signals are coupled. For example, ROW 2 of window 60 indicates that interconnect PAGE1_SEQUENCER/VCC is coupled to PAGE2_REGISTER1/VCC and PAGE_3_LATCH/VCC via the signal V5. Similarly, ROW 3 indicates that interconnect PAGE1_SEQUENCER/GND is coupled to PAGE2_REGISTER1/GND and PAGE_3_LATCH/GND via the signal MAIN_GND. In this manner, interconnect output 18 presents each interconnect along a first dimension, i.e., the rows of window 60, and the respective signals and other interconnects to which the signals are coupled along a second dimension, i.e., the columns of window 60.

Various implementations and embodiments of the invention have been described. Nevertheless, it is understood that various modifications can be made without departing from the invention. Accordingly, these and other embodiments are within the scope of the following claims.

What is claimed is:

1. A method comprising:

accessing data that defines a circuit in accordance with a hardware description language;

processing the data to identify instances of circuit components having interconnects and signals coupled to the interconnects; and generating output that includes a sorted representation of the interconnects based on names associated with the interconnects, wherein the output indicates for each of the interconnects a respective signal associated with the interconnect and the other interconnects coupled to the signal, wherein generating the output comprises generating the output in a two-dimensional format in which the sorted representation of the interconnects is presented along a first dimension, and the respective signals and interconnects coupled to the signals are presented along a second dimension.

2. The method of claim 1, wherein the two-dimensional format comprises a matrix having rows and columns, and generating the output comprises:

generating the rows to list the sorted representation of the interconnects grouped by the instances associated with the interconnects; and generating the columns to list the respective signal associated with the instance of each row and the interconnects coupled to the signal.

3. The method of claim 1, wherein generating the output comprises generating the output for display within a spreadsheet software application.

4. The method of claim 1, further comprising accessing the data with a hardware description language editor.

5. The method of claim 1, further comprising generating the data from a circuit design tool.

6. The method of claim 1, wherein accessing the data comprises accessing a text file.

7. The method of claim 1, wherein accessing the data comprises accessing data that defines the circuit in accordance with a very high-speed integrated circuits hardware description language (VHDL).

8. A method comprising:

accessing data that defines a circuit in accordance with a hardware description language;

processing the data to identify instances of circuit components having interconnects and signals coupled to the interconnects; and generating output that includes an ordered representation of the interconnects and indicates for each of the interconnect a respective signal associated with the interconnect and the other interconnects coupled to the signal, wherein generating the output comprises generating the output to include page identifiers of schematic diagrams associated with the instances.

9. The method of claim 8, wherein generating the output comprises arranging the representation of the instances in an order based on the page identifiers for the respective schematic diagrams associated with the instances.

10. A method comprising:

accessing data that defines a circuit in accordance with a hardware description language;

processing the data to identify instances of circuit components having interconnects and signals coupled to the interconnects;

parsing the data to extract insurance information, interconnect information, and signal information;

storing the extracted information within a three-dimensional data structure having a first dimension on for storing the instance information, a second dimension for storing the interconnect information, and a third dimension for storing the signal information; and generating output that include; an ordered representation of the interconnects and indicates for each of the interconnects a respective signal associated with the interconnect and the other interconnects coupled to the signal.

11. The method of claim 10, further comprising:

sorting the data within the three-dimensional data structure to order the data based on logical names for the interconnects; and generating the output in accordance with the ordered data within the three-dimensional data structure.

12. A system comprising a computer-readable medium to store data that defines a circuit in accordance with a hardware description language; and an interconnect analysis module to process the data to identify instances of circuit components having interconnects mod signals coupled to the interconnects, and generate output having a sorted representation of the interconnects based on names associated with the interconnects, wherein the output indicates for each interconnect a respective signal associated with the interconnect and the other interconnects coupled to the signal, and wherein the interconnect analysis module generates the output in two-dimensional format in which the sorted representation of the interconnects is presented along a first dimension, and the respective signals and interconnects coupled to the signals are presented along a second dimension.

13. The system of claim 12, wherein the interconnect analysis module generates the output for display within a spreadsheet software application.

14. The system of claim 12, wherein the interconnect analysis module parses the data to extract instance information, interconnect information, and signal information, and stores the extracted information within a three-dimensional data structure having a first dimension for storing the instance information, a second dimension for storing the interconnect information, and a third dimension for storing the signal information.

15. The system of claim 14, wherein the interconnect analysis module sorts the information within the three-dimensional data structure to order the data based on logical names for the in interconnects.

16. The system of claim 12, further comprising a circuit design tool to generate the data in response to input from a user.

17. The system of claim 12, further comprising a circuit design tool to generate the data in a response to input from a user.

18. The system of claim 12, wherein the data comprises a text file.

19. The system of claim 12, wherein the instances comprise at least one of instances of discrete electronic components and instances of functional blocks for an integrated circuit, and the interconnects comprise at least one of pins for the discrete electronic components and ports for the functional blocks.

20. The system of claim 12, wherein the data defines the circuit in accordance with a very high-speed integrated circuits hardware description language (VHDL).

21. A system comprising:

a computer-readable medium to store data that defines a circuit in accordance with a hardware description language; and an interconnect analysis module to process the data to identify instances of circuit components having interconnects and signals coupled to the interconnects, and generate output having an ordered representation of the interconnects, wherein the output indicates for each interconnect a respective signal associated with the interconnect and the other interconnects coupled to the signal, wherein the interconnect analysis module generates the output to include page identifiers of schematic diagrams associated with the instances.

22. The system of claim 21, wherein the interconnect analysis module arranges the reputation of the instances in order based on the page identifiers for the respective schematic pages associated with the instances.

23. A system comprising:

a computer-readable medium to store data that defines a circuit in accordance with a hardware description language; and an interconnect analysis module to process the data to identify instances of circuit components having interconnects and signals coupled to the interconnects, and generate output having an ordered representation of the interconnects, wherein the output indicates for each interconnect a respective signal associated with the interconnect and the other interconnects coupled to the signal, wherein the two-dimensional format comprises a matrix having rows and columns, and the interconnect analysis module generates the rows to list the ordered representation of the interconnects grouped by the instances associated with the interconnects, and generates the columns to list the respective signal associated with the instance of each row and the interconnects coupled to the signal.

24. A method comprising:

parsing data that defines an electrical circuit in accordance with a hardware description language to extract instance information that defines instances of components within the circuit, interconnect information that defines interconnects for the instances, and signal information that defines signals coupled to the interconnects;

sorting the interconnect information based on logical names for the instances associated the interconnects;

sorting the instance information in based on page identifiers for schematic diagrams associated with the instances; and generating output based on the sorted instance information and the sorted interconnect information.

25. The method of claim 24, wherein generating output comprises generated the output to include an ordered representation of the interconnects, and indicate for each interconnect a respective signal associated with the interconnect and the other interconnects coupled to the signal.

26. The method of claim 24, wherein generating the output comprises generating the output in a two-dimensional format in which the ordered representation of the interconnects is presented along a first dimension, and the respective signals and interconnects coupled to the signals are presented along a second dimension.

27. The method of claim 24, wherein generating the output comprises generating the output for display within a spreadsheet software application.

28. The method of claim 24, further comprising accessing the data with a hardware description language editor.

29. The method of claim 24, further comprising generating the data from a circuit design tool.

30. The method of claim 24, wherein accessing the data comprises accessing a text file.

31. The method of claim 24, wherein accessing the data comprises accessing data that defines the circuit in accordance with a very high-speed integrated circuits hardware description language (VHDL).

32. A system comprising means for defining a circuit in accordance with a hardware description language; and means for processing the data to identify instances of circuit components having interconnects and signals coupled to the interconnects, and generate output having a ordered representation of the interconnects that is sorted based on names of the interconnects, wherein the output indicates for each interconnect a respective signal associated with the interconnect and the other interconnects coupled to the signal, and wherein the processing means generates the output to include page identifiers for schematic diagrams associated with the instances.

33. The system of claim 32, wherein the processing means arrange the representation of the instances in order based on the page identifiers for the respective schematic pages associated with the instances.

34. The system of claim 32, wherein the processing means generates the output in a two-dimensional format in which the ordered representation of the interconnects is presented along a first dimension, and the respective signals and interconnects coupled to the signals are presented along a second dimension.

* * * * *

UNITED STATES PATENT AND TRADEMARK OFFICE
CERTIFICATE OF CORRECTION

PATENT NO. : 6,868,531 B1
DATED : March 15, 2005
INVENTOR(S) : Cory J. Hovanetz

It is certified that error appears in the above-identified patent and that said Letters Patent is hereby corrected as shown below:

Column 9,
Line 1, "interconnect" should read -- interconnects --.
Line 20, "on" should be omitted.
Line 24, "include" should read -- includes --.
Line 49, "output in" should read -- output in a --.

Column 10,
Line 36, "reputation" should read -- representation --.

Column 12,
Line 9, "a" should read -- an --.

Signed and Sealed this

Twenty-fourth Day of May, 2005

JON W. DUDAS
*Director of the United States Patent and Trademark Office*

UNITED STATES PATENT AND TRADEMARK OFFICE
CERTIFICATE OF CORRECTION

PATENT NO. : 6,868,531 B1
DATED : March 15, 2005
INVENTOR(S) : Cory J. Hovanetz

It is certified that error appears in the above-identified patent and that said Letters Patent is hereby corrected as shown below:

Column 9,
Line 1, "interconnect" should read -- interconnects --.
Line 20, "on" should be omitted.
Line 24, "include" should read -- inlcudes --.
Line 49, "output in" should read -- output in a --.

Column 10,
Line 36, "reputation" should read -- representation --.

Column 12,
Line 9, "a" should read -- an --.

Signed and Sealed this

Fourteenth Day of June, 2005

JON W. DUDAS
*Director of the United States Patent and Trademark Office*